US009523754B2

(12) United States Patent
Park et al.

(10) Patent No.: US 9,523,754 B2
(45) Date of Patent: Dec. 20, 2016

(54) IMAGE PROCESSING METHOD AND MEDICAL IMAGING APPARATUS EMPLOYING THE METHOD

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Hyun-wook Park, Daejeon (KR); Jae-moon Jo, Seongnam-si (KR); Joon-sung Choi, Daejeon (KR); Ye-ji Han, Daejeon (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 131 days.

(21) Appl. No.: 14/517,071

(22) Filed: Oct. 17, 2014

(65) Prior Publication Data

US 2015/0117739 A1  Apr. 30, 2015

(30) Foreign Application Priority Data

Oct. 25, 2013  (KR) .......................... 10-2013-0128035

(51) Int. Cl.
*G06K 9/00* (2006.01)
*G01R 33/565* (2006.01)
(Continued)

(52) U.S. Cl.
CPC ......... *G01R 33/565* (2013.01); *G01R 33/4835* (2013.01); *G01R 33/482* (2013.01);
(Continued)

(58) Field of Classification Search
CPC ............. G01R 33/565; G01R 33/4835; G01R 33/4824; G01R 33/561; G01R 33/482; G01R 33/5635
(Continued)

(56) References Cited

U.S. PATENT DOCUMENTS 5,167,232 A * 12/1992 Parker ................. G01R 33/563
324/306
6,037,771 A * 3/2000 Liu .................... G01R 33/0041
324/309

(Continued)

FOREIGN PATENT DOCUMENTS

JP  2001190517 A  7/2001
JP  2013-192940 A  9/2013
(Continued)

OTHER PUBLICATIONS

Xie et al., Cardiac Magnetic Resonance Imaging using Radial k-space Sampling and Self-Calibrated Partial Parallel Reconstruction, May 2010, NIH public access, pp. 1-20.*
Communication dated Sep. 25, 2014 from the Korean Intellectual Property Office in a counterpart Korean application No. 10-2013-0128035.
(Continued)

*Primary Examiner* — John Strege
(74) *Attorney, Agent, or Firm* — Sughrue Mion, PLLC

(57) ABSTRACT

A method for generating an image by using a medical imaging apparatus includes acquiring first slab data which relates to a first imaging slab, acquiring second slab data which relates to a second imaging slab at a position which is different from a position of the first imaging slab, and generating a restored image by using data from among the acquired first slab data and data from among the acquired second slab data in slices which correspond to a same position on an object.

15 Claims, 8 Drawing Sheets

(51) Int. Cl.
*G01R 33/483* (2006.01)
*G01R 33/48* (2006.01)
*G01R 33/561* (2006.01)
*G01R 33/563* (2006.01)

(52) U.S. Cl.
CPC ........ *G01R 33/4824* (2013.01); *G01R 33/561* (2013.01); *G01R 33/5635* (2013.01)

(58) Field of Classification Search
USPC ........................................................ 382/128
See application file for complete search history.

(56) References Cited

U.S. PATENT DOCUMENTS

| | | | |
|---|---|---|---|
| 6,043,654 A * | 3/2000 | Liu | G01R 33/4835 324/306 |
| 7,898,253 B2 * | 3/2011 | Dai | G01R 33/56308 324/307 |
| 8,170,311 B2 * | 5/2012 | Ying | G01R 33/561 382/128 |
| 8,674,691 B2 * | 3/2014 | Du | 324/307 |
| 2010/0104157 A1 | 4/2010 | Doyle | |
| 2012/0283549 A1 | 11/2012 | Miyazaki et al. | |
| 2013/0249913 A1 | 9/2013 | Smout et al. | |

FOREIGN PATENT DOCUMENTS

| | | |
|---|---|---|
| KR | 1020090070999 A | 7/2009 |
| KR | 1020100047806 A | 5/2010 |
| KR | 10-2013-0077653 A | 7/2013 |

OTHER PUBLICATIONS

Communication issued on Apr. 13, 2015 by the Korean Intellectual Property Office in related Application No. 10-2013-0128035.
Communication issued on May 6, 2015 by the European Patent Office in related Application No. 14189623.3.
Jiang et al., "MRI of Moving Subjects Using Multislice Snapshot Images With Volume Reconstruction (SVR): Application to Fetal, Neonatal, and Adult Brain Studies", IEEE Transactions on Medical Imaging, vol. 26, No. 7 Jul. 1, 2007, 14 total pages.
Liu et al., "Sliding Interleaved MOTSA: A Novel Multi-Slab 3D MRA Technique with Suppressed Slab Boundary Artifact", Proceedings of the 5th Annual Meeting of the International Society for Magnetic Resonance in Medicine, 1997, 1 page total.
Liu et al., "Systematic Assessment and Evaluation of Sliding Intreleaved ky (SLINKY) Acquisition for 3D MRA", Journal of Magnetic Resonance Imaging, vol. 8, No. 4, Jul. 1, 1998, 18 total pages.
Roberts et al., Sliding Interleaved Projection Reconstruction Acquisition (SLIPR), Proceedings of the International Society for Magnetic Resonance in Medicine, 7th Scientific Meeting & Exhibition, May 24, 1999, 1 page total.
Choi et al., "Sliding Time of Flight (TOF) using a tornado filter", Proceedings of the 2014 Annual Meeting ISMRM-ESMRMB, May 10, 2014, 1 page total.
Choi et al., "Sliding Time of Flight: Sliding Time of Flight MR Angiography Using a Dynamic Image Reconstruction Method", Magnetic Resonance in Medicine: Official Journal of the Society of Magnetic Resonance in Medicine / Society of Magnetic Resonance in Medicine, vol. 73, No. 3, Apr. 4, 2014, 8 total pages.

* cited by examiner

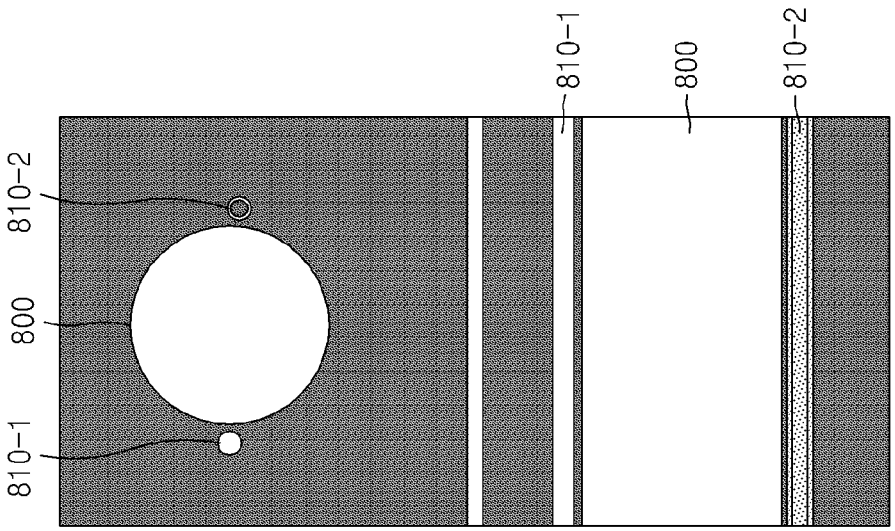
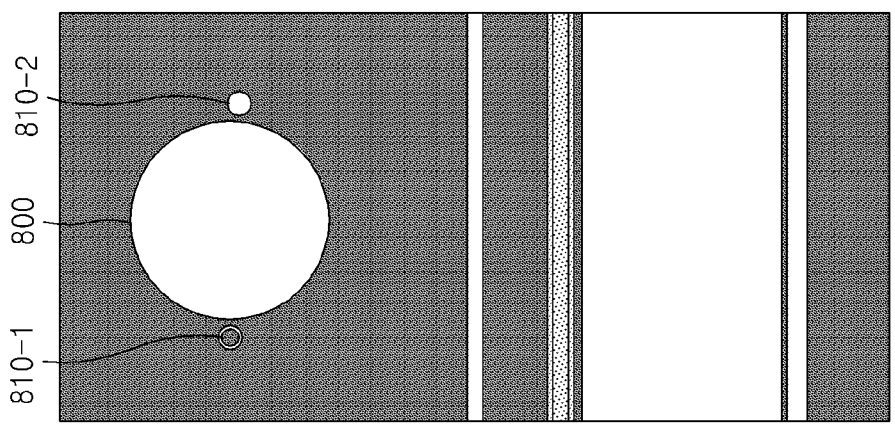
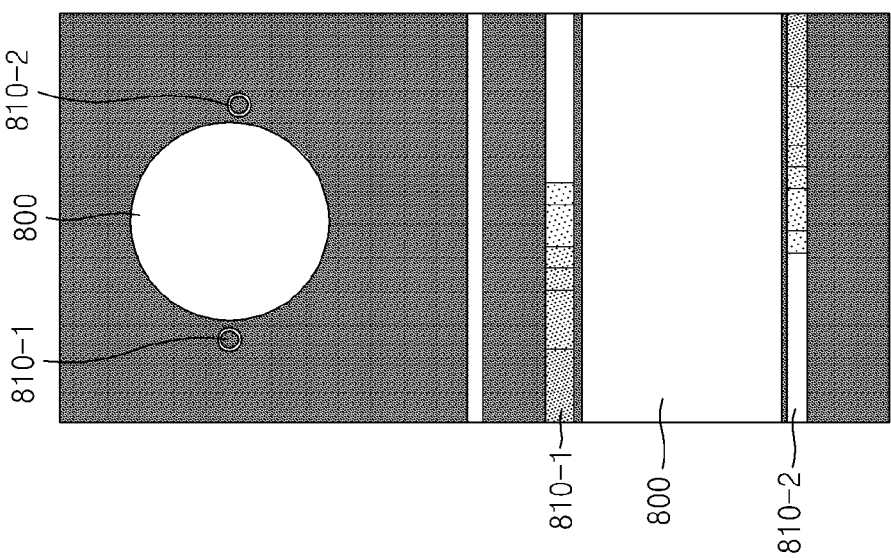

IMAGE PROCESSING METHOD AND MEDICAL IMAGING APPARATUS EMPLOYING THE METHOD

CROSS-REFERENCE TO RELATED APPLICATIONS

This application claims the priority from Korean Patent Application No. 10-2013-0128035, filed on Oct. 25, 2013 in the Korean Intellectual Property Office, the disclosure of which is incorporated herein by reference in its entirety.

BACKGROUND

1. Field

One or more exemplary embodiments relate to a method for generating a medical image by acquiring data by using a medical imaging apparatus and a medical imaging apparatus employing the method, and more particularly, to a method and apparatus for generating a medical image having a high contrast and a relatively reduced presence of artifacts.

2. Description of the Related Art

A variety of methods have been developed for capturing the interior of the human body by using a medical imaging apparatus. Such methods include, for example, angiography for capturing an image of blood vessels using X-rays, computed tomography (CT) using X-rays, and magnetic resonance angiography (MRA).

When the contrast of an image is increased according to a related art, artifacts are generated in the image. However, when the artifacts are reduced, the contrast of the image decreases, and thus, a desired image of body organs or other body parts may not be clearly identified.

SUMMARY

One or more exemplary embodiments include a medical imaging apparatus and an image generation method whereby an image having a high contrast and a reduced presence of artifacts may be generated.

Additional aspects will be set forth in part in the description which follows and, in part, will be apparent from the description, or may be learned by practice of the presented exemplary embodiments.

According to one or more exemplary embodiments, a method for generating an image by using a medical imaging apparatus includes acquiring first slab data which relates to a first imaging slab which is located at a first position, acquiring second slab data which relates to a second imaging slab which is located at a second position which is different from the first position, and generating a restored image by using data from among the acquired first slab data and data from among the acquired second slab data in slices which correspond to a same position on an object.

The generating the restored image may include generating a composite image by using first slice data which relates to a first slice from among the slices and second slice data which relates to a second slice from among the slices, and generating the restored image by using the composite image.

The generating the restored image by using the composite image may include generating the restored image by using the composite image and slice data selected from among at least one of the first slice data and the second slice data based on a contrast.

The generating the restored image may include assigning a respective weight based on a corresponding contrast value of each of the first slice data and the second slice data to each of the first slice data and the second slice data, and restoring the image based on the data to which the weights are assigned.

The acquiring the first slab data may include using a first sampling rate which is lower than a predetermined minimum image restoration sampling rate, and the acquiring the second slab data may include using a second sampling rate which is lower than the predetermined minimum image restoration sampling rate.

A distance between the second position and the first position may be substantially equal to a thickness of at least one slice from among the slices.

At least one from among the acquired first slab data and the acquired second slab data may include data which is acquired based on radial sampling.

According to one or more exemplary embodiments, a medical imaging apparatus includes a data acquisition module configured to acquire first slab data which relates to a first imaging slab which is located at a first position and to acquire second slab data which relates to a second imaging slab which is located at a second position which is different from the first position, and an image processor configured to generate a restored image by using data from among the acquired first slab data and data from among the acquired second slab data in slices which correspond to a same position on an object.

The image processor may be further configured to generate a composite image by using first slice data which relates to a first slice from among the slices and second slice data which relates to a second slice from among the slices, and to generate a restored image by using the composite image.

The image processor may be further configured to generate the restored image by using the composite image and slice data from among at least one of the first slice data and the second slice data, which slice data is determined based on a contrast.

The image processor may be further configured to assign a respective weight based on a corresponding contrast value of each of the first slice data and the second slice data to each of the first slice data and the second slice data, and to restore the image based on the data to which the weights are assigned.

The data acquisition module may be further configured to acquire each of the first slab data and the second slab data by using a sampling rate which is lower than a predetermined minimum image restoration sampling rate.

A distance between the second position and the first position may be substantially equal to a thickness of at least one slice from among the slices.

The data acquisition module may be further configured to acquire each of the first slab data and the second slab data based on radial sampling.

According to one or more exemplary embodiments, a non-transitory computer readable storage medium has stored thereon a program which, when executed by a computer, implements the above method.

BRIEF DESCRIPTION OF THE DRAWINGS

These and/or other aspects will become apparent and more readily appreciated from the following description of exemplary embodiments, taken in conjunction with the accompanying drawings in which:

FIGS. 8A and 8B illustrate images that are restored, according to an exemplary embodiment.

DETAILED DESCRIPTION

Figure 1:
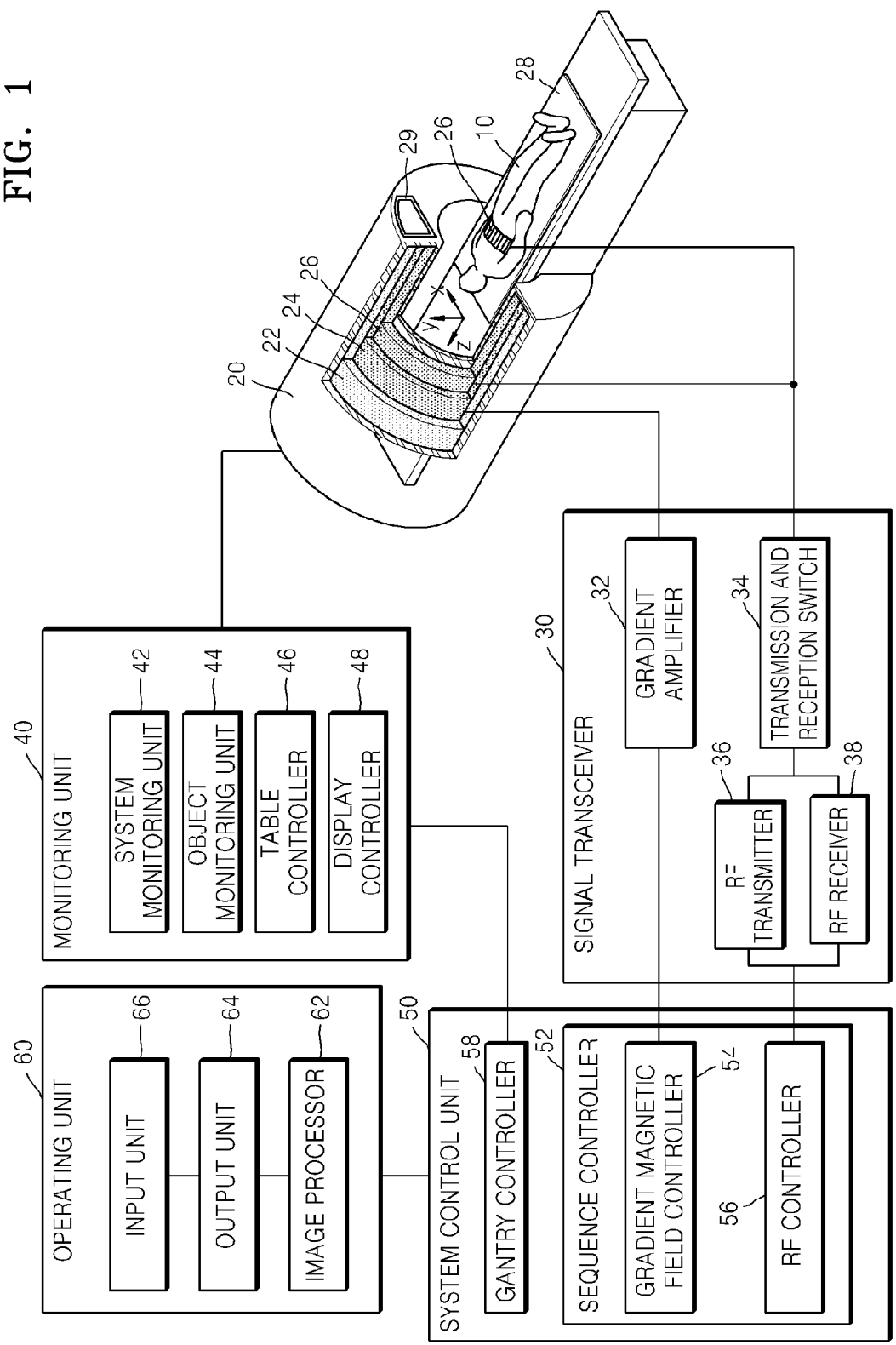
FIG. 1 is a block diagram of a general magnetic resonance imaging (MRI) system.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The terms used in the present disclosure are briefly described and the exemplary embodiments are described in detail.

The terms used in the present disclosure have been selected from general terms in consideration of the functions in the exemplary embodiments. However, these terms may vary according to the intention of any person of ordinary skill in the art, legal precedents, or the advent of new technologies. Further, for special cases, for terms selected by the applicant, the meanings of these selected terms are described in detail in the Detailed Description section. Accordingly, the terms used in the present disclosure are defined based on the descriptions throughout the specification, not by their simple meanings.

When a part may "include" a certain constituent element, unless specified otherwise, it may not be construed to exclude another constituent element, but instead may be construed to further include other constituent elements. Terms such as "~portion", "~unit", "~module", and "~block", as stated in the specification, may signify a unit to process at least one function or operation, and the unit may be embodied by hardware such as a field-programmable gate array (FPGA) or an application-specific integrated circuit (ASIC), software, or a combination of hardware and software. However, the unit may be configured to be located in a storage medium to be addressed or configured to be able to operate one or more processors. Accordingly, the unit as an example may include any one or more of constituent elements such as software constituent elements, object-oriented software constituent elements, class constituent elements, and task constituent elements, processes, functions, attributes, procedures, sub-routines, segments of program codes, drivers, firmware, microcodes, circuits, data, a database, data structures, tables, arrays, and variables. The constituent elements and functions provided by the "units" may be combined into a smaller number of constituent elements and units or may be further divided into additional constituent elements and units. Accordingly, the exemplary embodiments are not limited by a specific combination of hardware and software.

In the present specification, an "image" may signify multi-dimensional data formed of discrete image elements, for example, pixels in a two-dimensional (2D) image and voxels in a three-dimensional (3D) image. For example, an image may include any one or more of an X-ray image, a computed tomography (CT) image, a magnetic resonance imaging (MRI) image, an ultrasound image, a medical image of an object, and images which are acquired by other medical imaging apparatuses.

Further, in the present specification, an "object" may include any one or more of a human, an animal, or a part of a human or an animal. For example, an object may include organs such as the liver, heart, womb, brain, breast, abdomen, etc., or blood vessels. In addition, an object may include a phantom that is matter having a volume having approximately the same density and effective atomic number as a living thing, and may include a sphere phantom having properties similar to the human body.

Further, in the present specification, a "user" may include any one or more of a medical doctor, a nurse, a clinical pathologist, a medical imaging expert, a technician who fixes medical apparatuses, etc., but the exemplary embodiments are not limited thereto.

In addition, in the present specification, a "medical imaging apparatus" may include any one or more of an X-ray apparatus, CT apparatus, MRI apparatus, ultrasound apparatus, and/or other medical imaging apparatus. However, for convenience of explanation, the medical imaging apparatus is considered to be an MRI apparatus.

Further, in the present specification, an "imaging slice" denotes a unit area in the form of a plane for acquiring data to generate an image. Still further, an "imaging slab" denotes a unit area in the form of a flat plate having a certain thickness. The imaging slab may be formed of a plurality of imaging slices. For example, one imaging slab may include 32 imaging slices.

In addition, in the present specification, "magnetic resonance imaging (MRI)" denotes an image of an object acquired by using the nuclear magnetic resonance principle.

Further, in the present specification, a "pulse sequence" denotes continuity of a signal repeatedly applied by an MRI apparatus. A pulse sequence may include a time parameter of an RF pulse, for example, repetition time (TR) and time to echo (TE).

Still further, in the present specification, a "pulse sequence diagram" shows a sequence of events occurring in an MRI apparatus. For example, a pulse sequence diagram may show a radio frequency (RF) pulse, a gradient magnetic field, and/or a magnetic resonance (MR) signal as a function of time.

An MRI apparatus is an apparatus that acquires an image of a cross-section of an object by representing, in a contrast image, the strength of an MR signal with respect to an RF signal generated in a magnetic field having a particular strength. For example, when a patient is in a strong magnetic field and an RF signal for resonating a particular atomic nucleus, for example, a hydrogen atomic nucleus, is instantly transmitted toward the patient and then is stopped, the particular atomic nucleus generates an MR signal. As the MRI system receives the MR signal, an MR image may be obtained. The MR signal denotes an RF signal that is generated from the object. The amplitude of an MR signal may be determined based on the concentration of predetermined atoms, for example, hydrogen, included in an object, relaxation time T1, relaxation time T2, and a blood flow.

The MRI apparatus has characteristics that are different from those of other imaging apparatuses. For example, unlike imaging apparatuses such as a CT apparatus that acquires an image based on an orientation for detecting hardware, the MRI apparatus may acquire a 2D image or a 3D volume image that is independent of orientation for detecting hardware. Further, unlike a CT apparatus, X-ray apparatus, PET apparatus, and SPECT apparatus, the MRI apparatus does not expose an object and an examiner to radioactive rays. Because the MRI apparatus is capable of obtaining an image having a high soft tissue contrast, the MRI apparatus may be used to obtain any one or more of a neurological image, an intravascular image, a musculoskeletal image, and an oncologic image, in which a clear description of abnormal tissue is important.

FIG. 1 is a block diagram of a general MRI system. Referring to FIG. 1, the MRI system may include a gantry 20, a signal transceiving unit (also referred to herein as a "signal transceiver") 30, a monitoring unit (also referred to herein as a "monitor") 40, a system control unit (also referred to herein as a "system controller") 50, and an operating unit (also referred to herein as an "operator") 60.

The gantry 20 prevents outward radiation of an electromagnetic wave that is generated by a main magnet 22, a gradient coil 24, and a radio frequency (RF) coil 26. A static magnetic field and a gradient magnetic field are formed in a bore (not shown) inside the gantry 20, and an RF signal is transmitted toward an object 10, for example, a patient.

The main magnet 22, the gradient coil 24, and the RF coil 26 may be arranged along a predetermined direction of the gantry 20. The predetermined direction may be a coaxial cylindrical direction. The object 10 may be disposed on a table 28 that may be inserted into a cylinder of the gantry 20 along a horizontal axis of the cylinder.

The main magnet 22 generates a static magnetic field in order to align the orientation of magnetic dipole moments of atomic nuclei included in the object 10 in a predetermined direction. As the magnetic field generated by the main magnet 22 is stronger and more uniform, a relatively accurate MR image of the object 10 may be obtained.

The gradient coil 24 includes X, Y, and Z coils that generate respective gradient magnetic fields in corresponding directions along an X axis, a Y axis, and a Z axis that are perpendicular (i.e., mutually orthogonal) to one another. The gradient coil 24 may provide positional information which relates to each part of the object 10 by inducing a different resonant frequency for each part of the object 10.

The RF coil 26 may transmit an RF signal to a patient and receive an MR signal generated from the patient. In detail, the RF coil 26 may transmit an RF signal having the same frequency as the precession frequency of an atomic nucleus that performs a precession motion to a patient, and may stop the transmission of the RF signal. Then, the RF coil 26 may receive the MR signal generated from the patient.

For example, in order to cause a particular atomic nucleus to transition from a lower energy state to a higher energy state, the RF coil 26 may generate an electromagnetic signal, for example, an RF signal, having a radio frequency corresponding to the type of the particular atomic nucleus, and then apply the generated electromagnetic signal to the object 10. When the electromagnetic wave signal generated by the RF coil 26 is applied to a particular atomic nucleus, the atomic nucleus may transition from a lower energy state to a higher energy state. Thereafter, when the electromagnetic wave signal generated by the RF coil 26 is removed, the atomic nucleus to which the electromagnetic wave signal was applied transitions from the higher energy state to the lower energy state and may emit an electromagnetic wave having a Larmor frequency. In this aspect, when the application of an electromagnetic wave signal to the atomic nucleus is stopped, a change in the energy level from a high energy to a low energy is generated at the atomic nucleus that received the electromagnetic wave so that the electromagnetic wave having a Larmor frequency may be emitted. The RF coil 26 may receive the electromagnetic wave signal emitted from the atomic nuclei inside the object 10.

The RF coil 26 may be embodied as a single RF transceiving coil that has a function of generating an electromagnetic wave having a radio frequency corresponding to the type of a particular atomic nucleus and a function of receiving the electromagnetic wave radiated from the atomic nucleus. Alternatively, the RF coil 26 may be embodied as an RF transmitting coil that has a function of generating an electromagnetic wave having a radio frequency corresponding to the type of the particular atomic nucleus and an RF receiving coil that has a function of receiving the electromagnetic wave radiated from the atomic nucleus.

Further, the RF coil 26 may be fixed on the gantry 20, or may be detachably provided on the gantry 20. The RF coil 26 that is detachable may include an RF coil which is configured for a particular part of the object 10, for example, any one or more of a head RF coil, a chest RF coil, a leg RF coil, a neck RF coil, a shoulder RF coil, a wrist RF coil and an ankle RF coil.

In addition, the RF coil 26 may communicate with an external device in a wired and/or wireless manner, and may also perform dual tune communication based on a communication frequency range.

The RF coil 26 may include any one or more of a birdcage coil, a surface coil, and/or a transverse electromagnetic wave coil (TEM coil), based on a structure thereof.

Further, the RF coil 26 may include any one or more of a transmission exclusive coil, a receiving exclusive coil, and/or a transmitting and receiving coil, based on a corresponding RF signal transceiving method.

In addition, the RF coil 26 may be an RF coil which includes a variety of channels, for example, 16 channels, 32 channels, 72 channels, and/or 144 channels.

The gantry 20 may further include a display 29 which is disposed outside the gantry 20 and a display (not shown) disposed inside the gantry 20. Accordingly, a user or the object 10 may be provided with a predetermined piece of information via the displays disposed inside and outside the gantry 20.

The signal transceiving unit 30 may control a gradient magnetic field that is formed inside the gantry 20, that is, in the bore, based on a predetermined MR sequence, and may also control transceiving of the RF signal and the MR signal.

The signal transceiving unit 30 may include a gradient amplifier 32, a transceiving switch 34, an RF transmission unit (also referred to herein as an "RF transmitter") 36, and an RF receiving unit (also referred to herein as an "RF receiver") 38.

The gradient amplifier 32 may drive the gradient coil 24 that is included in the gantry 20, and may supply a pulse signal in order to generate a gradient magnetic field to the gradient coil 24 under control of a gradient control unit 54. Gradient magnetic fields in directions along the X, Y, and Z axes may be synthesized by controlling the pulse signal applied by the gradient amplifier 32 to the gradient coil 24.

The RF transmission unit 36 and the RF receiving unit 38 may drive the RF coil 26. The RF transmission unit 36 may supply an RF pulse having a Larmor frequency to the RF coil 26. The RF receiving unit 38 may receive the same MR signal that the RF coil 26 receives.

The transceiving switch 34 may control the transceiving directions of the RF signal and the MR signal. For example, an RF signal is transmitted toward the object 10 via the RF coil 26 in a transmission mode, and an MR signal from the object 10 is received via the RF coil 26 in a receiving mode. The transceiving switch 34 may be controlled based on a control signal which is output from an RF control unit (also referred to herein as an "RF controller") 56.

The monitoring unit 40 may monitor and/or control the gantry 20 and/or devices mounted on the gantry 20. The monitoring unit 40 may include a system monitoring unit (also referred to herein as a "system monitor") 42, an object monitoring unit (also referred to herein as an "object monitor") 44, a table control unit (also referred to herein as a "table controller") 46, and a display control unit (also referred to herein as a "display controller") 48.

The system monitoring unit 42 may monitor and control a static magnetic field, a gradient magnetic field, an RF signal, the RF coil 26, the table 28, a device that measures physical information of the object 10, power supply, a heat exchanger, and a compressor.

The object monitoring unit 44 may monitor the object 10. In detail, the object monitoring unit 44 may include any one or more of a camera for observing a motion or position of the object 10, a respiration measurement device for measuring respiration of the object 10, an electrocardiogram (ECG) measurement device for measuring an ECG of the object 10, and/or a temperature measurement device for measuring the temperature of the object 10.

The table control unit 46 controls a movement of the table 28 on which the object 10 is placed. The table control unit 46 may control the movement of the table 28 based on a sequence control of the system control unit 50. For example, when moving imaging of the object 10, the table control unit 46 may continuously or sporadically move the table 28 based on the sequence control of the system control unit 50. Accordingly, the object 10 may be captured via a field of view (FOV) that is greater than that of the gantry 20.

The display control unit 48 controls the displays which are disposed inside and outside the gantry 20. In detail, the display control unit 48 may control turning on/off of the displays which are disposed inside and outside the gantry 20 and/or a screen of the displays. In addition, when a speaker is disposed inside or outside of the gantry 20, the display control unit 48 may control turning on/off of the speaker or sound to be output via the speaker.

The system control unit 50 may include a sequence control unit (also referred to herein as a "sequence controller") 52 for controlling a sequence of signals generated in the gantry 20, and a gantry control unit (also referred to herein as a "gantry controller") 58 for controlling the gantry 20 and devices provided in the gantry 20.

The sequence control unit 52 may include a gradient control unit (also referred to herein as a "gradient magnetic field controller") 54 for controlling the gradient amplifier 32 and the RF control unit 56 for controlling the RF transmission unit 36, the RF receiving unit 38, and the transceiving switch 34. The sequence control unit 52 may control the gradient amplifier 32, the RF transmission unit 36, the RF receiving unit 38, and the transceiving switch 34, based on a pulse sequence received from the operating unit 60. The pulse sequence may include all pieces of information which are required for controlling the gradient amplifier 32, the RF transmission unit 36, the RF receiving unit 38, and the transceiving switch 34. For example, the pulse sequence may include information which relates to an amplitude, an application duration, and an application timing of a pulse signal to be applied to the gradient coil 24.

The operating unit 60 may output pulse sequence information to the system control unit 50 and simultaneously control the overall operation of the MRI system.

The operating unit 60 may include an image processing unit (also referred to herein as an "image processor") 62 which is configured for processing the MR signal received by the RF receiving unit 38, an output unit (also referred to herein as an "output device") 64, and an input unit (also referred to herein as an "input device") 66.

The image processing unit 62 may process the MR signal received by the RF receiving unit 38 and generate MR image data which relates to the object 10.

The image processing unit 62 may perform any one or more of various signal processing operations such as, for example, amplification, frequency conversion, phase detection, low frequency amplification, and/or filtering on the MR signal received by the RF receiving unit 38.

The image processing unit 62 may arrange digital data, for example, in a k space (referred to as a Fourier space or a frequency space) of a memory (not shown) and reconstruct the digital data into image data by performing 2-dimensional or 3-dimensional Fourier conversion on the digital data.

Further, the image processing unit 62 may perform, as necessary, synthesis processing and/or differential operation processing on the image data. The synthesis processing may include pixel addition processing and/or maximum intensity projection (MIP). In addition, the image processing unit 62 may store, in the memory or in an external server, not only the reconstructed image data but also the image data on which synthesis processing or differential operation processing is performed.

Further, the various signal processing operations that the image processing unit 62 performs on the MR signal may be performed in parallel. For example, signal processing operations are performed in parallel on a plurality of MR signals received by a multichannel RF coil so that the MR signals may be reconstructed into image data.

The output unit 64 may be configured to output, to a user, the image data generated by the image processing unit 62, and/or the reconstructed image data. Further, the output unit 64 may output information which is required for operation of the MRI system, for example, user interface (UI), user information, and/or object information. The output unit 64 may include any one or more of a speaker, a printer, a CRT display, an LCD display, a PDP display, an OLED display, a FED display, an LED display, a VFD display, a DLP display, a PFD display, a 3D display, and/or a transparent display, and may also include other various output devices within a range that is well-known to those skilled in the art.

The user may input object information, parameter information, and/or information which relates to the scan condition, the pulse sequence, the image synthesis, or the differential operation, via the input unit 66. The input unit 66 may include any one or more of a keyboard, a mouse, a trackball, a voice recognition unit, a gesture recognition unit, or a touch screen, and may also include various input devices within a range that is well-known to those skilled in the art.

Although in FIG. 1 the signal transceiving unit 30, monitoring unit 40, the system control unit 50, and the operating unit 60 are illustrated as separate elements, the function performed by each of the signal transceiving unit 30, monitoring unit 40, the system control unit 50, and the operating unit 60 may be performed by another element. For example, although the image processing unit 62 is described to convert the MR signal received by the RF receiving unit 38 into a digital signal, the conversion to the digital signal may be performed directly by the RF receiving unit 38 or the RF coil 26.

The gantry 20, the RF coil 26, the signal transceiving unit 30, the monitoring unit 40, the system control unit 50, and the operating unit 60 may be connected in a wired or wireless manner. When the above elements are connected in a wireless manner, a device (not shown) for synchronizing clocks therebetween may be further provided. The gantry 20, RF coil 26, the signal transceiving unit 30, monitoring unit 40, the system control unit 50 and the operating unit 60 may communicate with one another by using any one or more of a variety of communication methods, for example, a high speed digital interface such as low voltage differential signaling (LVDS), asynchronous serial communication such as universal asynchronous receiver transmitter (UART), a low delay network protocol such as error synchronous serial communication or a controller area network (CAN), or optical communications. In addition, a variety of communication methods may be used within a range that is well-known to those skilled in the art.

According to the present exemplary embodiment, the MRI system may further include a communication unit (also referred to herein as a "communicator" or as a "communication device").

Figure 2:
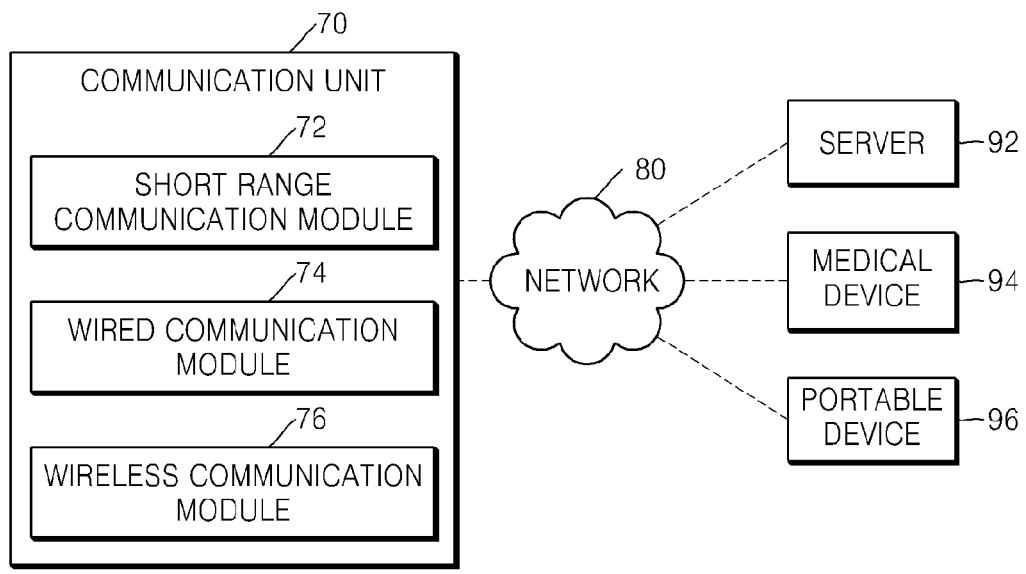
FIG. 2 is a block diagram which illustrates a configuration of a communication unit.

FIG. 2 illustrates a configuration of a communication unit 70. The communication unit 70 may be connected to at least one of the gantry 20, the signal transceiving unit 30, the monitoring unit 40, the system control unit 50, and the operating unit 60, which are illustrated in FIG. 1.

The communication unit 70 may exchange data with a hospital server and/or other medical devices in the hospital via a picture archiving and communication system (PACS), and may perform data communication in accordance with a digital imaging and communications in medicine (DICOM) standard.

As illustrated in FIG. 2, the communication unit 70 is connected to a network 80 in a wired or wireless manner so as to communicate with a server 92, a medical device 94, and/or a portable device 96, which are located outside the MRI system.

In detail, the communication unit 70 may transceive data which relates to a diagnosis of the object 10 via the network 80, and may also transceive a medical image that is captured by the medical device 94, for example, a CT image, MRI image, or X-ray image. Furthermore, the communication unit 70 may receive a diagnosis history and/or a treatment schedule of a patient from the server 92, and use the received information for facilitating a diagnosis of the object 10. Further, the communication unit 70 may perform data communication not only with the server 92 or the medical device 94 in the hospital, but also with the portable device 96, such as, for example, any one or more of mobile phones, PDAs, and/or notebook computers of medical doctors or patient.

Further, the communication unit 70 may transmit information which relates to a state of the MRI system and/or medical image quality information to a user via the network 80, and may receive a feedback which relates to the information from the user.

The communication unit 70 may include at least one element which is capable of communicating with an external device, such as, for example, a short range communication module 72, a wired communication module 74, and a wireless communication module 76.

The short range communication module 72 denotes a module which is configured for performing short range communications with a device located within a predetermined distance. According to the present exemplary embodiment, short range communication technology may include any one or more of wireless LAN, Wi-Fi, Bluetooth, ZigBee, Wi-Fi Direct (WFD), ultra wideband (UWB), infrared data association (IrDA), Bluetooth low energy (BLE), and near field communication (NFC), but the present exemplary embodiment is not limited thereto.

The wired communication module 74 denotes a module for performing communication using an electric signal or an optical signal. Wired communication technology may include, for example, any one or more of a pair cable, a coaxial cable, and/or an optical fiber cable, and other well-known wired communication technology.

The wireless communication module 76 transceives a wireless signal with at least one of a base station, an external device, and a server in a mobile communication network. The wireless signal may include any one or more of various types of data which relate to transceiving of a voice call signal, a video call signal, and/or a text/multimedia message.

Figure 3:
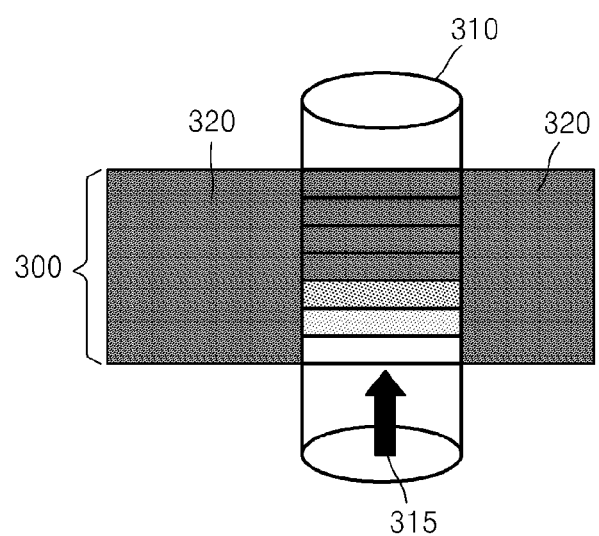
FIG. 3 is a conceptual view of magnetic resonance angiography (MRA)

FIG. 3 is a conceptual view of a magnetic resonance angiography imaging device. When an RF pulse is selectively applied to a predetermined imaging slice or imaging slab 300, a signal whose amplitude is reduced compared to the amplitude before saturation is generated from a static tissue 320 that repeatedly receives the RF pulse because of saturation of a slice or slab of the static tissue 320 due to a saturation RF pulse. In contrast, for a blood flow 315 that newly flows in a blood vessel 310, because the blood flow 315 has not received the RF pulse, a signal having a relatively large amplitude is generated from the blood vessel 310.

An imaging slice denotes a unit area in the form of a plane for acquiring data to generate an image. In addition, an imaging slab denotes a unit area in the form of a flat plate having a thickness. The imaging slab may include a plurality of imaging slices. For example, the imaging slab may include 32 sheets of imaging slices.

As such, an image may be generated by using a relatively large signal that is generated from the blood flow 315 that newly flows and a relatively small signal is generated from the static tissue 320. In the above method, either a 2D imaging technique or a 3D imaging technique may be used.

When a 2D imaging technique is used, an image having a high contrast between blood vessels and adjacent tissues may be generated. In contrast, when a 2D imaging technique is used, a signal-to-noise ratio decreases. Further, when a 2D imaging technique is used, the thickness of an imaging slice increases compared to the case when a 3D imaging technique is used. When a 3D imaging technique is used, although a resolution and a signal-to-noise ratio of a generated image are high, a contrast of the image is relatively low, because an RF pulse which has a relatively low angle of incidence is used in order to decrease artifacts on a blood vessel. In contrast, when an RF pulse which has a relatively high angle of incidence is used, a contrast increases, but a signal strength which corresponds to a blood vessel may be decreased in a latter half part of an imaging slab. To reduce the artifacts, a time for acquiring an image increases. Accordingly, in the present disclosure, a method and apparatus for restoring an image having a high resolution, a high signal-to-noise ratio, and a high contrast is described below.

Figure 4:
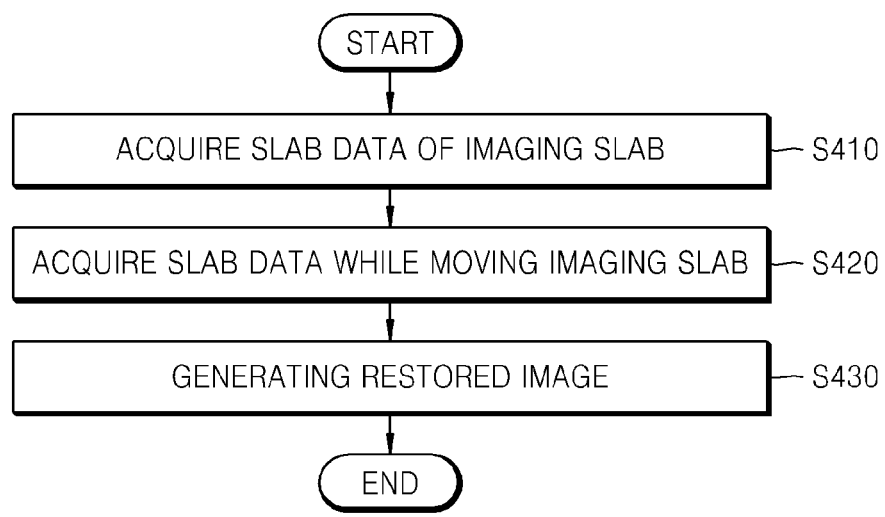
FIG. 4 is a flowchart which illustrates a process for generating an image, according to an exemplary embodiment.

FIG. 4 is a flowchart which illustrates a process for generating an image, according to an exemplary embodiment.

First, in operation S410, a medical imaging apparatus acquires slab data which relates to an imaging slab. Next, in operation S420, the medical imaging apparatus may acquire slab data which relates to an imaging slab while moving the imaging slab in a preset direction. For example, the medical imaging apparatus may acquire a first slab data which relates to a first imaging slab which is located at a first position in operation S410 and a second slab data which relates to a second imaging slab which is located at a second position which is different from the first position, for example, by a distance which is substantially equal to a width of one slice in the preset direction in operation S420. According to the present exemplary embodiment, the medical imaging apparatus may change the imaging slab by changing a frequency band of an RF pulse. In particular, according to the exemplary embodiment, operations S410 and S420 may be performed by 3D imaging.

According to the present exemplary embodiment, in operations S410 and S420, because data which respectively relate to a plurality of imaging slabs are acquired, the medical imaging apparatus may acquire data by using a sampling rate which is lower than a minimum sampling rate required for image restoration. In operations S410 and S420, the medical imaging apparatus may acquire data based on any one of radial sampling, variable density sampling, and Cartesian sampling.

The medical imaging apparatus repeats the above operations several times so as to acquire data while changing the position of the imaging slab along the preset direction. Then, in operation S430, the medical imaging apparatus may generate a restored image by using the data included in a slice which corresponds to a same position on the object 10 from among the acquired slab data.

Figure 5:
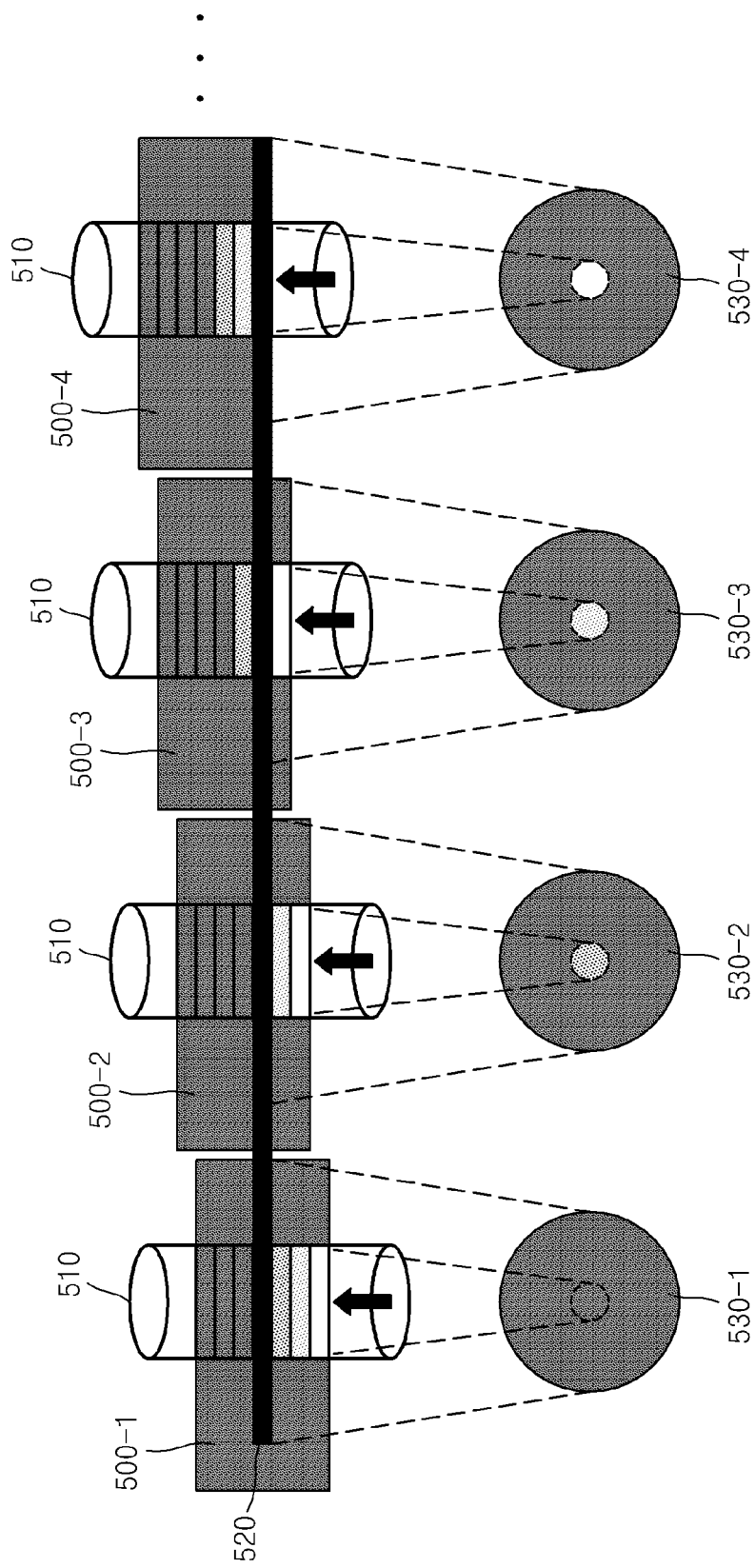
FIG. 5 is a conceptual view which illustrates a method by which a medical imaging apparatus acquires data, according to an exemplary embodiment.

FIG. 5 is a conceptual view which illustrates a method which is performable by using a medical imaging apparatus configured to acquire data, according to an exemplary embodiment.

First, the medical imaging apparatus may acquire data by applying an RF pulse to an imaging slab 500-1 at a preset initial position. Then, the medical imaging apparatus may sequentially acquire respective slab data which relates to each imaging slab with respect to imaging slabs 500-2, 500-3, and 500-4 of FIG. 5.

When the slab data which relates to each imaging slab is acquired, the acquired data may be inverse Fourier transformed in a direction along a kz axis. Slice data 530-1, 530-2, 530-3, and 530-4 which are included in a slice which corresponds to the same position 520 in a blood vessel 510 exhibit characteristics in the slice data 530-1, 530-2, 530-3, and 530-4 of FIG. 5. In particular, each of the slice data 530-1, 530-2, 530-3, and 530-4 includes information that is identical with respect to the static tissue and also includes a different signal value for an area corresponding to the blood vessel 510. The medical imaging apparatus may restore an image based on the slice data 530-1, 530-2, 530-3, and 530-4 included in a slice which corresponds to the same position 520 on the blood vessel 510.

The medical imaging apparatus may acquire data based on a reduced sampling rate with respect to each slab.

The medical imaging apparatus may restore an image based on the data acquired as illustrated in FIG. 5. A method for restoring an image according to an exemplary embodiment will be described in detail with reference to FIG. 6.

Figure 6:
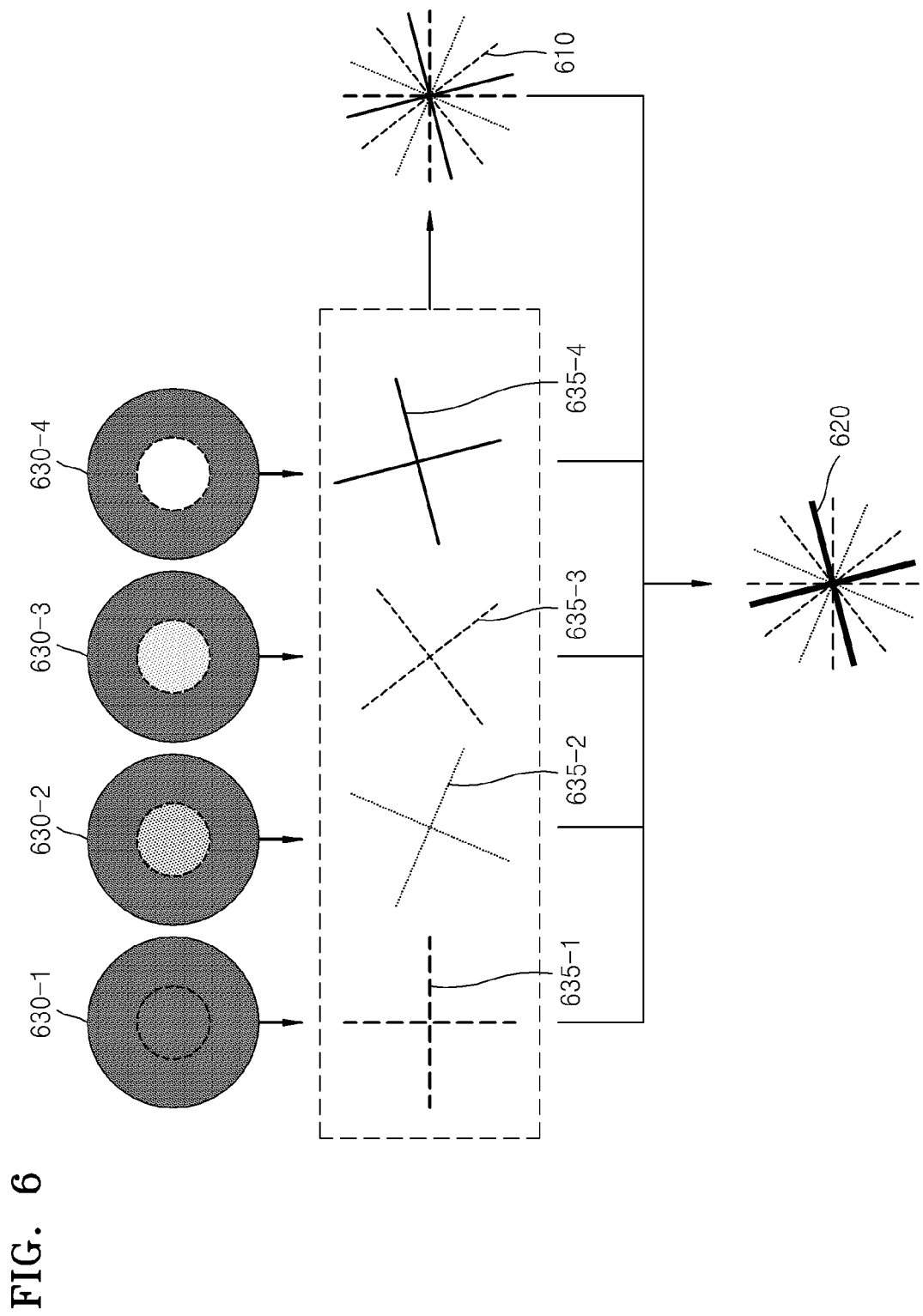
FIG. 6 is a conceptual view which illustrates a method for generating an image based on the acquired data, according to an exemplary embodiment.

FIG. 6 is a conceptual view which illustrates a method for generating an image based on the data acquired in operations S410 and S420, according to an exemplary embodiment.

For convenience of explanation, among the data acquired in FIG. 5, slice data 630-1, 630-2, 630-3, and 630-4 included in slices at the same position of the object 10 are conceptually illustrated as shown in FIG. 6. The image processing unit 62 of the medical imaging apparatus may generate a composite image 610 by using the slice data 635-1, 635-2, 635-3, and 635-4. The composite image 610 is a high resolution image wherein aliasing artifacts have been removed by synthesizing the slice data 635-1, 635-2, 635-3, and 635-4 and also an image which shows an average contrast between a blood vessel and static tissue. The medical imaging apparatus may restore an image by using the composite image 610.

According to the present exemplary embodiment, a method that is used in dynamic MRI may be used to restore an image. For example, a technique such as compressed sensing, highly constrained image reconstruction (HYPR), or complex expectation maximization (see, e.g., Joonsung Choi et al., "An Iterative Reconstruction Method Of Complex Images Using Expectation Maximization For Radial Parallel MRI", PMB, 2013) may be employed. When an image is restored by using an iterative method, the composite image 610 is set to include an initial input image and the slice data 635-4 which has a relatively high contrast is used as the acquired data so that an image having a high contrast and fewer artifacts may be restored. By performing the above-described method, a blood flow in a blood vessel in all slices of the restored image may appear to have a high contrast. In addition, only a blood flow in a desired direction may be restored to be bright by using a direction of the blood flow. Accordingly, an artery or a vein may be selectively restored from data acquired at a particular time.

Further, according to the present exemplary embodiment, a respective weight may be assigned to each of slice data 635-1, 635-2, 635-3, and 635-4 based on the contrast of each slice data. In particular, a higher weight may be assigned to a slice data having a higher contrast. Then, the medical imaging apparatus may restore an image based on the slice data to which a weight is assigned. Accordingly, a relatively highest weight may be assigned to the slice data 635-4 having the highest contrast, and a restored image 620 having a high contrast may be generated based on the slice data 635-4 to which the highest weight is assigned.

Figure 7:
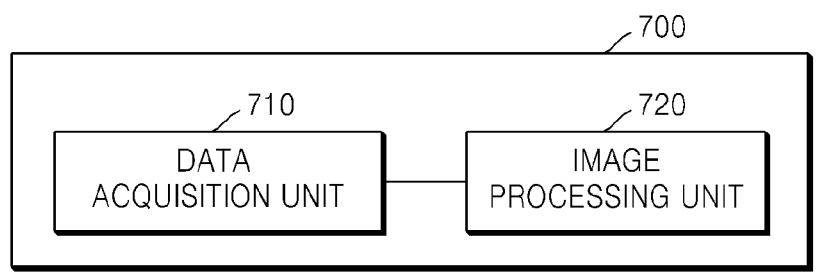
FIG. 7 is a block diagram which schematically illustrates a configuration of a medical imaging apparatus, according to an exemplary embodiment.

FIG. 7 is a block diagram which schematically illustrates a configuration of a medical imaging apparatus, according to an exemplary embodiment.

According to the present exemplary embodiment, a medical imaging apparatus 700 may include a data acquisition unit (also referred to herein as a "data acquirer" or as a "data acquisition module") 710 and an image processing unit (also referred to herein as an "image processor") 720. FIG. 7 illustrates merely an example, and the medical imaging apparatus 700 may further include elements other than the elements illustrated in FIG. 7, or may be substituted by the equivalent elements as the elements of FIG. 7.

According to the present exemplary embodiment, the data acquisition unit 710 may be configured by including the signal transceiving unit 30 of FIG. 1. Further, the configuration of the data acquisition unit 710 may be variously modified according to exemplary embodiments.

According to the present exemplary embodiment, the data acquisition unit 710 acquires the slab data which relates to the imaging slab at a preset initial position. Then, the data acquisition unit 710 may move the position of the imaging slab by changing a frequency band of an RF pulse, and thus may continuously acquire the slab data which relates to the imaging slab at a subsequent position while moving the position of the imaging slab.

According to the present exemplary embodiment, because the data acquisition unit 710 acquires data which relates to a plurality of imaging slabs, the medical imaging apparatus may acquire data by using a sampling rate which is lower than a sampling rate required for image restoration. The data acquisition unit 710 may acquire data based on any one of radial sampling, variable density sampling, and Cartesian sampling.

According to the present exemplary embodiment, the image processing unit 720 may generate a restored image by using the data that belongs to the slab data acquired by the data acquisition unit 710 and is included in a slice which corresponds to a same position on the object 10. When the data acquisition unit 710 acquires the slab data, the image processing unit 720 may perform an inverse Fourier transform on the acquired data in the direction of the kz axis. Thereafter, the image processing unit 720 may restore an image based on the slice data included in the slice which corresponds to the same position on the object 10.

According to the present exemplary embodiment, the image processing unit 720 may generate a composite image from the slice data included in the slice which corresponds to the same position on the object 10. The image processing unit 720 may restore an image by using the composite image.

According to the present exemplary embodiment, a method that is used in dynamic MRI may be employed to restore an image. For example, any one or more of the techniques such as compressed sensing, HYPR, or complex expectation maximization may be employed. When an image is restored in an iterative method, the composite image is set to be an initial input image and the slice data having a high contrast is used as the acquired data, so that an image having a high contrast and fewer artifacts may be restored. By execution of the above-described method, a blood flow in a blood vessel in all slices of the restored image may appear to have a high contrast. Further, only a blood flow in a desired direction may be restored to be bright by using a direction of the blood flow. Accordingly, an artery or a vein may be selectively restored from acquired data which is acquired at a particular time.

Further, according to the present exemplary embodiment, the image processing unit 720 may assign a respective weight to each of the slice data based on the respective contrast of each corresponding item of slice data. In particular, as the contrast increases, a higher weight may be assigned to the slice data. The medical imaging apparatus may restore an image based on the slice data to which a weight is assigned. Accordingly, the medical imaging apparatus may assign the highest weight to the slice data having a highest contrast, and may generate a restored image having a high contrast based on the slice data to which a high weight is assigned.

FIGS. 8A and 8B illustrate images that are restored, according to an exemplary embodiment.

FIGS. 8A and 8B illustrate results of the maximum intensity projections (MIP) in transverse and coronal directions onto an object in which two water tubes are installed around a bottom phantom. Further, FIG. 8A illustrates an image which is restored based on data acquired as a single slab based on a 3D time of flight (TOF) method, and FIG. 8B illustrates an image which is restored according to an exemplary embodiment as disclosed in the present disclosure.

It may be seen in FIG. 8A that brightness of a flow in a tube decreases as the flow receives an RF pulse. In contrast, it may be seen in FIG. 8B that the brightness does not decrease. Further, it may be seen in FIG. 8B that a desired tube may only be selectively restored based on a flow direction.

Figure 9A:
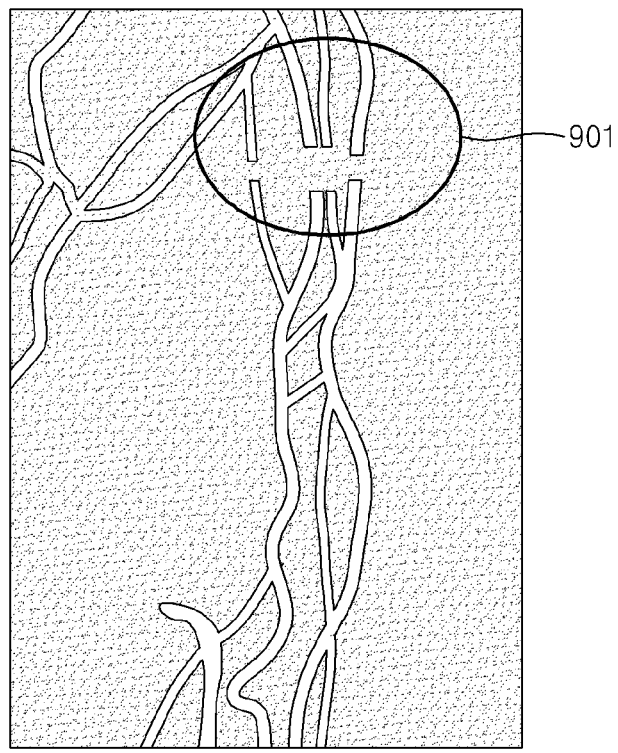
FIGS. 9A and 9B illustrate images of blood vessels, according to an exemplary embodiment.
Figure 9B:
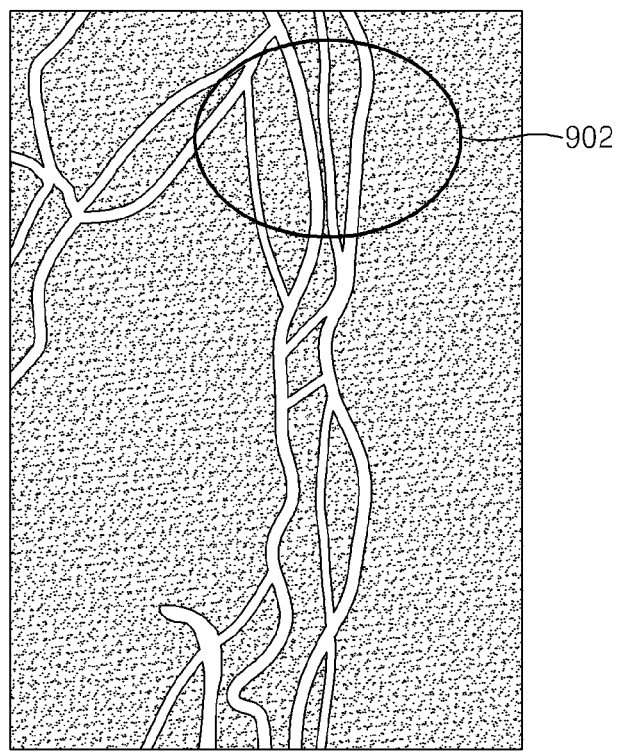

FIGS. 9A and 9B illustrate images of blood vessels, according to an exemplary embodiment.

FIG. 9A illustrates an image that is restored from data acquired from four (4) slabs at a flip angle of 18°. Each single slab includes twenty (20) slices, each slice having a thickness of 1 mm. Further, FIG. 9B illustrates an image that is restored from data acquired according to an exemplary embodiment based on a slab which includes twenty (20) slices, each slice having a thickness of 1 mm, at a flip angle of 40°.

When comparing an area 901 of FIG. 9A and an area 902 of FIG. 9B, it may be seen that the image restored based on the data acquired in accordance with the image disclosed in the present disclosure has a relatively high contrast and a relatively reduced presence of artifacts.

In addition, other exemplary embodiments can also be implemented via the use of computer readable code/instructions in/on a medium, e.g., a computer readable medium, to control at least one processing element to implement any above-described exemplary embodiment. The medium can correspond to any transitory or non-transitory medium/media permitting the storage and/or transmission of the computer readable code.

The computer readable code can be recorded/transferred on a medium in a variety of ways, with examples of the medium including recording media, such as magnetic storage media (e.g., ROM, floppy disks, hard disks, etc.) and optical recording media (e.g., CD-ROMs, or DVDs), and transmission media such as Internet transmission media. Thus, the medium may be such a defined and measurable structure including or carrying a signal or information, such as a device carrying a bitstream according to one or more exemplary embodiments. The medium may also be a distributed network, so that the computer readable code is stored/transferred and executed in a distributed fashion.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the present inventive concept as defined by the following claims.

What is claimed is:

1. A method for generating an image by using a medical imaging apparatus, the method comprising:
   acquiring first slab data which relates to a first imaging slab which is located at a first position;
   acquiring second slab data which relates to a second imaging slab which is located at a second position which is different from the first position; and
   generating a restored image by using data from among the acquired first slab data and data from among the acquired second slab data in slices which correspond to a same position on an object, wherein the generating the restored image comprises:

generating a composite image by using first slice data which relates to a first slice from among the slices and second slice data which relates to a second slice from among the slices; and generating the restored image by using the composite image and slice data selected from among at least one of the first slice data and the second slice data based on a contrast.

2. The method of claim 1, wherein the generating the restored image comprises assigning a respective weight based on a corresponding contrast value of each of the first slice data and the second slice data to each of the first slice data and the second slice data, and restoring the image based on the data to which the weights are assigned.

3. The method of claim 1, wherein the acquiring the first slab data comprises using a first sampling rate which is lower than a predetermined minimum image restoration sampling rate, and the acquiring the second slab data comprises using a second sampling rate which is lower than the predetermined minimum image restoration sampling rate.

4. The method of claim 1, wherein a distance between the second position and the first position is substantially equal to a thickness of at least one slice from among the slices.

5. The method of claim 1, wherein at least one from among the acquired first slab data and the acquired second slab data includes data which is acquired based on radial sampling.

6. A medical imaging apparatus comprising:

a data acquisition module configured to acquire first slab data which relates to a first imaging slab which is located at a first position and to acquire second slab data which relates to a second imaging slab which is located at a second position which is different from the first position; and an image processor configured to generate a restored image by using data from among the acquired first slab data and data from among the acquired second slab data in slices which correspond to a same position on an object, to generate a composite image by using first slice data which relates to a first slice from among the slices and second slice data which relates to a second slice from among the slices, and to generate the restored image by using the composite image and slice data from among at least one of the first slice data and the second slice data, which slice data is determined based on a contrast.

7. The medical imaging apparatus of claim 6, wherein the image processor is further configured to assign a respective weight based on a corresponding contrast value of each of the first slice data and the second slice data to each of the first slice data and the second slice data, and to restore the image based on the data to which the weights are assigned.

8. The medical imaging apparatus of claim 6, wherein the data acquisition module is further configured to acquire each of the first slab data and the second slab data by using a sampling rate which is lower than a predetermined minimum image restoration sampling rate.

9. The medical imaging apparatus of claim 6, wherein a distance between the second position and the first position is substantially equal to a thickness of at least one slice from among the slices.

10. The medical imaging apparatus of claim 6, wherein the data acquisition module is further configured to acquire each of the first slab data and the second slab data based on radial sampling.

11. A non-transitory computer readable storage medium having stored thereon a program which, when executed by a computer, implements the method of claim 1.

12. A method for generating an image by using a medical imaging apparatus, the method comprising:

acquiring first data which relates to a first position of the medical imaging apparatus with respect to an object;

acquiring second data which relates to a second position of the medical imaging apparatus with respect to the object, the second position being different from the first position; and generating a restored image by combining data from among the acquired first data which corresponds to at least a first cross-sectional slice of the object with data from among the acquired second data which is determined to correspond to the same at least first cross-sectional slice of the object, wherein the generating the restored image comprises:

generating a composite image by using first slice data which relates to the first cross-sectional slice of the object and second slice data which relates to a second cross-sectional slice of the object; and generating the restored image by using the composite image, wherein the generating the restored image comprises assigning a respective weight based on a corresponding contrast value of each of the first slice data and the second slice data to each of the first slice data and the second slice data, and restoring the image based on a result of the assigning.

13. The method of claim 12, wherein a distance between the second position and the first position is substantially equal to a thickness of the first cross-sectional slice.

14. The method of claim 12, wherein at least one from among the acquired first data and the acquired second data includes data which is acquired based on radial sampling.

15. The method of claim 1, wherein the contrast comprises an image contrast value associated with at least one from among the first slice data and the second slice data.

* * * * *